United States Patent [19]

Gray

[11] Patent Number: 4,885,484

[45] Date of Patent: Dec. 5, 1989

[54] VOLTAGE CLAMPED DIFFERENTIAL TO SINGLE ENDED CONVERTER CIRCUIT

[75] Inventor: Randall C. Gray, Tempe, Ariz.

[73] Assignee: Motorola, Inc., Schaumburg, Ill.

[21] Appl. No.: 215,118

[22] Filed: Jul. 5, 1988

[51] Int. Cl.⁴ .............................................. C06G 7/12
[52] U.S. Cl. ................................... 307/495; 307/355; 307/544; 307/564; 307/570; 330/257; 330/288; 323/315
[58] Field of Search ................ 307/495, 356, 544, 297, 307/564, 570, 299.2, 355; 330/288, 257; 323/315, 316, 317

[56] References Cited

U.S. PATENT DOCUMENTS

| | | |
|---|---|---|
| 3,872,323 | 3/1975 | Frederiksen et al. ............ 307/362 |
| 4,194,166 | 3/1980 | Sakai et al. ........................ 330/257 |
| 4,319,181 | 3/1982 | Wrathall ............................ 323/315 |
| 4,406,955 | 9/1983 | Cascio ............................... 307/355 |
| 4,450,367 | 5/1984 | Whatley ............................ 307/297 |
| 4,577,121 | 3/1986 | Sano et al. ........................ 307/355 |
| 4,605,891 | 8/1986 | Wrathall ............................ 323/313 |
| 4,760,286 | 7/1988 | Pigott ................................ 307/350 |

Primary Examiner—Andrew J. James
Assistant Examiner—Nancy Thai
Attorney, Agent, or Firm—Michael D. Bingham

[57] ABSTRACT

A MOS differential to single ended converter circuit is provided for supplying a single ouput signal in response to first and second differentially related current being supplied to first and second junctions thereof. The converter circuit includes first and second MOS transistors each having gate, drain and source electrodes with the gate electrodes being coupled together while the drain and gate electrodes of the first transistor are interconnected. The drain and source electrodes of the pair of transistors are respectively coupled in series with the first and second junctions. First and second bipolar transistors each having first, second and control electrodes are provided for limiting the voltage swing at the drain of the second MOS transistor. The contol and first electrodes of the first bipolar transistor are coupled respectively to the first and second junctions whiled the control and first electrodes of the second bipolar transistor are respectively coupled to the second and first junctions with the second electrodes of the two bipolar transistors being coupled to an additional common terminal.

7 Claims, 1 Drawing Sheet

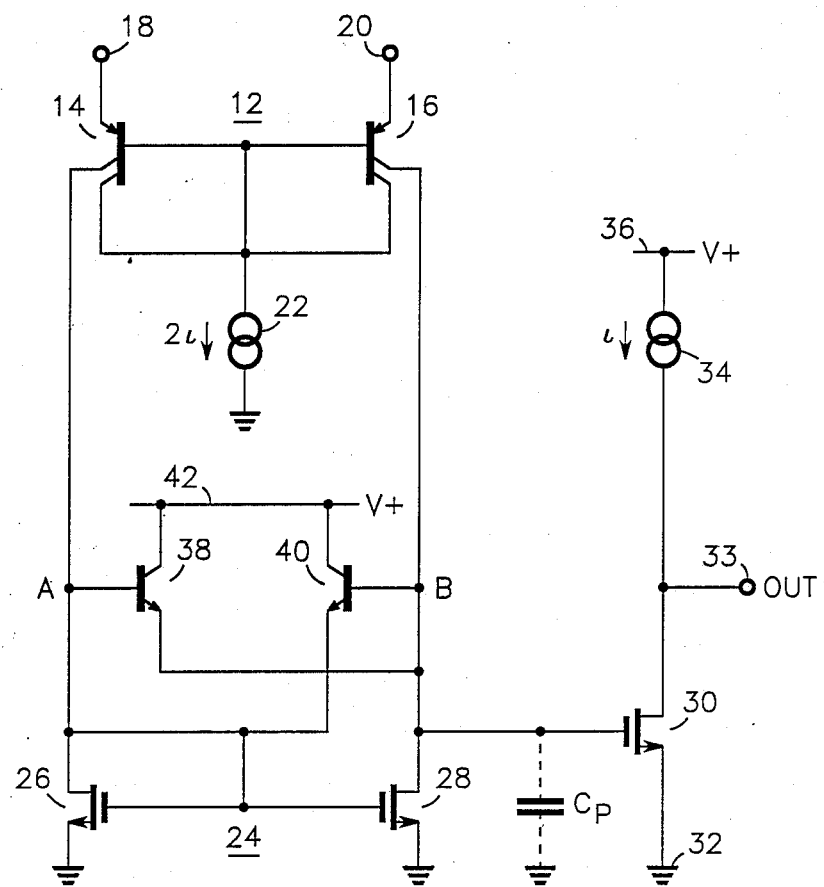

VOLTAGE CLAMPED DIFFERENTIAL TO SINGLE ENDED CONVERTER CIRCUIT

BACKGROUND OF THE INVENTION

The present invention relates to Power BIMOS applications and, more particularly, to a circuit for clamping the voltage swings possible in an NMOS turn around or differential to single ended converter circuit.

In integrated circuits (IC's) incorporating both bipolar and MOS active devices, it is common (especially in high power applications) to have the substrate of the IC at a high potential with respect to ground potential. Therefore, it is important that the isolated epitaxial regions of the IC, in which the bipolar devices are formed, are not allowed to be at a low voltage with respect to the substrate. If this were allowed to happen a SCR latch would be created due to forward biasing of the substrate-epitaxial junction region. This SCR latch could cause severe damage or even destroy the IC in high power applications.

It is common to use NMOS circuitry because of its high voltage capabilities in conjunction with bipolar devices in integrated circuits. Typically, NMOS circuitry in a BIMOS integrated circuit is utilized to provide control functions. For example, a conventional comparator circuit including a differential bipolar transistor input section can be used in conjunction with an NMOS differential to single ended converter circuit to provide an output signal that changes output level states as the differentially applied input signals vary above and below a predetermined threshold value as is well understood.

However, the above described circuit generally exhibits undesirable large switching delays due to the NMOS transistors. Because of large gate voltage variations in the NMOS differential to single ended converter and the fact that the charging currents at the comparator trip point are small, the switching time delay is dependent on these parameters and the parasitic capacitance of the NMOS devices.

Hence, a need exists for clamping the voltage swing across the output NMOS device of the converter circuit to reduce the switching time delay.

SUMMARY OF THE INVENTION

Accordingly, it is an object of the present invention to provide a voltage clamped NMOS differential to single ended converter circuit.

It is another object to provide and improved BIMOS comparator circuit.

In accordance with the above and other objects there is provided a MOS differential to single ended converter circuit comprising first and second MOS transistors each having gate, drain and source electrodes with the gate electrodes being coupled together and the drain and gate electrodes of the first transistor being interconnected at a first junction, the drain electrode of the second transistor being coupled to a second junction, the source electrodes of the transistors being coupled to a common terminal and including first and second bipolar transistors each having first, second and control electrodes, the control and first electrodes of the first bipolar transistor being coupled respectively to the first and second junctions whiled the control and first electrodes of the second bipolar transistors are respectively coupled to the second and first junctions and the second electrodes of the two bipolar transistors are coupled to an additional common terminal.

In one feature of the invention a pair of differentially related currents are respectively sourced to the first and second junctions whereby a single output signal is provided at the second junction the level of which varies between two voltage levels the values of which are limited by the bipolar transistors of the differential to single ended converter.

BRIEF DESCRIPTION OF THE DRAWING

The sole Figure is a schematic diagram of the voltage clamped differential to single ended converter circuit of the invention.

DETAILED DESCRIPTION OF THE PREFERRED EMBODIMENT

Turning to the sole Figure there is illustrated comparator 10 comprised of differential input section 12 and turn around or differential to single ended circuit 24. Differential input section 12 includes a pair of bipolar PNP multi-collector transistors 14 and 16 which receive a differential input signal supplied to terminals 18 and 20 at the respective emitters thereof. The bases of transistors 14 and 16 are interconnected with one of the collectors thereof to current supply 22. The other collectors of the transistors are coupled at junctions A and B to differential to single ended converter 24. Converter 24 is comprised of a pair of NMOS transistors 26 and 28 the source electrodes of which are returned to terminal 32 to which is supplied ground reference potential. The gate electrode of transistor 26 is connected both to its drain at junction A and to the gate electrode of transistor 28 while the drain electrode of the latter is returned to junction B. The output of converter 24 is taken at the drain of transistor 28 and is coupled to the gate of output NMOS transistor 30 the drain of which is coupled to output 33. The source of transistor 30 is coupled to terminal 32. Current source 34 is coupled between terminal 36, to which is supplied potential V, and the drain of transistor 30.

The operation of BIMOS (the combination of bipolar and MOS transistors) comparator 10 described above is conventional and is well known. Differential input section 12 provides first and second differentially related currents to junctions A and B responsive to the input signal applied at inputs 18 and 20.. Converter 24 is responsive to the currents provided at the collector outputs of differential input section 12 for providing a single output for alternately switching the operating state of transistor 30 depending on the relative magnitudes of the currents appearing at junctions A and B. For example, if transistor 16 s more conductive than transistor 14, the voltage at junction B will rise until the threshold voltage of transistor 30 is exceeded which turns the latter transistor on. Similarly, as transistor 14 is rendered more conductive than transistor 16, transistor 26 will bias transistor 28 on to sink all of the available current from transistor 28. The voltage at junction B will decrease below the threshold of transistor 30 thereby turning it off. The trip point of comparator 10, i.e., the point at which transistor 30 is switched between operating states occurs at balance when the two currents flowing from transistors 14 and 16 are equal. At the trip point a current i flows through transistors 26 and 28. Hence, if current supply 34 supplies a current of value i, the current densities of transistors 26, 28 and 30 will be equal at the comparator trip point. Thus, transistor will be tripped as the voltage at the gate thereof goes above and below $V_{GS}$, the gate to source voltage of the transistor.

Before transistor 30 can be switched on and off the parasitic capacitance $C_P$ must be charged and discharged which causes a switching time delay. $C_P$ is the combination of the inherent drain-source and gate-source parasitic capacitances of transistors 28 and 30 respectively. Because large gate voltages can be generated and the charging (discharging) currents at the comparator trip point are small, large switching time delays can result. If the gate voltage swing at the gate of transistor 30 can be limited or clamped to a small value above and below the threshold voltage of the transistor a minimum switching time delay results.

The addition of clamping transistors 38 and 40 of the preferred embodiment limits the voltage swing to plus and minus a $V_{BE}$ about the threshold voltage of transistor 30 (where $V_{BE}$ is the base-emitter voltage of the bipolar transistor) thereby reducing switching delays. As shown, the collector-emitter conduction path of transistor 38 is coupled between terminal 42 and junction B while the base is coupled to junction A. Likewise, the collector-emitter conduction path of transistor 40 is coupled between terminal 42 and junction A while its base is coupled to junction B. An operating potential $V+$ is applied to terminal 42.

Now, whenever the voltage at the gate of transistor 30 rises to one $V_{BE}$ above the gate to source threshold voltage of the transistor transistor 40 is rendered conductive to source current to transistor 26 which regulates the current through transistor 28. This clamps or limits the voltage to $V_{GS}+V_{BE}$, where $V_{GS}$ is the gate to source threshold voltage of transistor 30. Similarly, as the voltage at junction B decreases it is clamped to a value of $VG_S-V_{BE}$.

Hence, because the switching time delay is a function of both the voltage at the gate of transistor 30 and the charging current, since the total voltage swing is clamped to a reduced value with the addition of the clamping circuit, the time delay for charging the parasitic capacitance is reduced over that of the comparator not having a clamping circuit.

What is claimed is:

1. A differential to single ended converter circuit coupled to first and second current paths in which differentially related currents flow for providing a single output signal, comprising:
   a pair of MOS transistors each having gate, drain and source electrodes, said drain and gate of the first on of said pair of MOS transistors being coupled together, said drain and source of the first one of said pair of MOS transistors being coupled in the first current path, said gate of the second one of said pair of MOS transistors being coupled to said gate of said first transistor of said pair of MOS transistors and said drain and source of said second transistor of said pair of MOS transistors being coupled in the second current path;
   a first transistor having first, second and control electrodes, said first electrode being coupled to said drain electrode of said first transistor of said pair of MOS transistors, said second electrode being coupled to a power supply conductor, and said control electrode being coupled to said drain electrode of said second transistor of said pair of MOS transistors; and
   a second transistor having first, second and control electrodes, said first electrode being coupled to said drain electrode of said second transistor of said pair of MOS transistors, said second electrode being coupled to said power supply conductor and said control electrode being coupled to said drain electrode of said first transistor of said pair of MOS transistors.

2. The circuit of claim 1 including:
   a current source for providing a current of predetermined magnitude;
   a third MOS transistor having gate, drain and source electrodes, said gate electrode being coupled to said drain electrode of said second transistor of said pair of said MOS transistors, said drain and source electrodes being coupled in series with said current source; and
   means for coupling said drain electrode of said third MOS transistor to an output of the circuit.

3. The circuit of claim 2 wherein said first and second transistors are NPN transistors.

4. An integrated comparator circuit, comprising:
   a differential input section responsive to an applied input signal for providing first and second differentially related output currents;
   a differential to singled ended converter including a pair of MOS transistors responsive to said first and second differentially related currents for providing a single output signal;
   current source means for providing a current of predetermined magnitude at an output;
   an additional MOS transistor having gate, drain and source electrodes, said gate being coupled to said differential to single ended converter and receiving said single output signal, said drain and source electrodes being coupled in the current path of said current provided from said current source means with said drain electrode being coupled to an output of the comparator; and clamp circuit means for reducing the switching time delay of said additional MOS transistor by limiting the voltage swing at said gate of said additional MOS transistor about the gate threshold voltage of said additional MOS transistor to a predetermined upper and lower limit.

5. The comparator circuit of claim 4 wherein said pair of MOS transistors each having gate, drain and source electrodes, said gate electrodes being coupled together, said drain and source electrodes of the first one of said pair of MOS transistors being coupled in the path of said first differentially related current, said drain and source electrodes of the second one of said pair of MOS transistors being coupled in the path of said second differentially related current, said drain electrodes of said first and second ones of said pair of MOS transistors being coupled to said gate electrodes of said pair of MOS transistors and said gate electrode of said additional MOS transistor, respectively.

6. The comparator circuit of claim 5 wherein said clamp circuit means includes:
   a first transistor having first, second and control electrodes, said first electrode being coupled to said drain electrode of said first one of said pair of MOS transistors, said second electrode being coupled to a power supply conductor and said control electrode being coupled to said drain electrode of said second one of said pair of MOS transistors; and a second transistor having first, second and control electrodes, said first electrode being coupled to said drain electrode of said second one of said pair of MOS transistors, said second electrode being coupled to said power supply conductor and said control electrode being coupled to said drain electrode of said first one of said pair of MOS transistors.

7. The comparator circuit of claim 6 wherein said differential input section includes:

a pair of multi-collector, transistors, a first collector of each pair of multi-collector transistors being coupled to the base thereof with said base being coupled together, the emitters of said pair of multi-collector transistors being coupled to first and second terminals across which said input signal is applied a second collector of the first one of said pair of multi-collector transistors being coupled to said drain electrode of said first one of said pair of MOS transistors and a second collector of the second one of said pair of multi-collector transistors being coupled to said drain electrode of said second one of said pair of MOS transistors; and current supply means coupled to said bases of said pair of said multi-collector transistors for sinking a current of predetermined magnitude.

* * * * *